United States Patent [19]

Schoeff

[11] 4,092,639

[45] May 30, 1978

[54] DIGITAL TO ANALOG CONVERTER WITH COMPLEMENTARY TRUE CURRENT OUTPUTS

[75] Inventor: John A. Schoeff, Los Gatos, Calif.

[73] Assignee: Precision Monolithics, Inc., Santa Clara, Calif.

[21] Appl. No.: 646,766

[22] Filed: Jan. 6, 1976

[51] Int. Cl.² .......................................... H03K 13/02
[52] U.S. Cl. ........................ 340/347 DA; 340/347 M
[58] Field of Search ............... 340/347 DA, 347 AD, 340/347 C

[56] References Cited

U.S. PATENT DOCUMENTS

| | | | |
|---|---|---|---|
| 3,544,994 | 12/1970 | Hanson et al. | 340/347 DA |
| 3,832,707 | 8/1974 | Buchanan et al. | 340/347 DA |
| 3,842,412 | 10/1974 | Spottord | 340/347 DA |
| 3,940,760 | 2/1976 | Brokaw | 340/347 DA |
| 3,961,326 | 6/1976 | Craven | 307/244 X |

*Primary Examiner*—Thomas J. Sloyan

[57] ABSTRACT

A digital to analog converter is disclosed wherein two current outputs are provided, one the complement of the other. The digital to analog converter includes a novel two branched, symmetric, transistor switching circuit as well as an improved electrical n-bit weighting network which has ports for communicating weighted signal segments to connected transistor switching circuits. Logic inputs to the switching circuits determine whether an output signal is to be supplied in a first output summing line or a second, complementary, output summing line, both of which have high output impedance and high output voltage compliance which defines true current output.

30 Claims, 11 Drawing Figures

DIGITAL TO ANALOG CONVERTER WITH COMPLEMENTARY TRUE CURRENT OUTPUTS

BACKGROUND OF THE INVENTION a. Field of the Invention

This invention relates to digital to analog converters and more particularly to a digital to analog converter with a pair of complementary, true current outputs.

b. Prior Art

In digital to analog converters, DAC hereafter, it is desirable to produce an analog output from a digitally coded signal. Such a digitally coded signal usually appears as a digital word formed by the number of "bits", which are typically one's and zero's. Digital to analog converters for achieving this are well-known in the prior art, and the theory of operation for such circuits are described in the book "Analog Integrated Circuit Design," by A. B. Grebene, Van Nostrand, 1972, p. 328–350, incorporated by reference herein.

In the above-mentioned book, the author points out that the transfer function of a DAC can be written as follows:

$$A = P[b_1 2^{-1} + b_2 2^{-2} + \ldots + b_N 2^{-N}]$$

The implementation of the DAC contains four separate parts including a reference signal corresponding to the parameter P in the above equation; a set of binary switches to simulate the binary coefficients, $b_1, b_2, \ldots b_n$; a resistive weighting network which provides the factors $2^{-1}$ through $2^{-N}$, and an output summing line for forming the output of the apparatus, A.

A simplified apparatus for carrying out a DAC system is shown in FIG. 1 of the drawings. In FIG. 1, a series of resistors serve to decrement a reference current supplied by the reference source, $V_{REF}$, as such current is available along line 11. In FIG. 1, the decrementing resistors are labeled R, 2R, 4R, ... $2^{(N-1)}R$. Thus, twice as much current flows through branch 12 than branch 13. Twice as much current flows through branch 13 as flows through branch 14 and so on. Of course, current will flow toward the output terminal O, in line 16, only if a respective current switch is moved to its non-grounded position, opposite that shown in the figure.

To limit the spread in the value of resistors, networks have been devised which limit the spread of resistor values, yet achieve binary weighting of currents. One such network is known as a R-2R ladder network, discussed in the above mentioned book. An improved electrical ladder network is the subject of my copending patent application entitled "Multi-Stage Electrical Ladder for Decrementing a Signal Into a Plurality of Weighted Signals," Ser. No. 642,770, filed Dec. 22, 1975.

The switches S1, S2, S3, . . . SN are usually high speed current switches. Such switches of the prior art may be seen in U.S. Pat. Nos. 3,747,088 and 3,842,412.

A more advanced prior art switch is shown in FIGS. 2 and 3 of the drawings.

FIG. 1 of the drawings shows switches S1, S2, S3, SN for use in a simplified digital to analog converter where input currents supplied along line 11 by the source of $V_{REF}$ is decremented in lines 12, 13, 14, 15 by the respective resistors R, 2R, 4R, $2^{(n-1)R}$. Digital input signals are supplied to the switches S1, S2, S3, SN and determine the position of the switches for forming an analog signal which is supplied to the amplifier 17 and then to the output O.

FIG. 2 shows a prior art circuit which was described in an article entitled "A Complete Monolithic 10-b D/A Converter" by D. Dooley, appearing in IEEE Journal of Solid State Circuits, December 1973. In the circuit of FIG. 2, the transistors Q21, Q22, Q23, Q24, Q26 and Q27 form an emitter coupled logic gate which is Schottky clamped by the Schottky diodes D21, D22 for directing steering current between circuit branches wherein the transistors Q26, Q27 are situated. The transistors Q26, Q27 supply steering current to a mutually connected node A which is pulled by the current source 28 which is part of a ladder network indicated by the dashed line 29. Resistors R and 2R form extensions and rungs, respectively, of such a ladder network, for example of the R-2R type discussed in the book by Grebene, supra, p. 333.

Transistors Q26 and Q27 draw current from two different locations. Q26 draws current from digital ground, while Q27 draws current from a sum line 30. Thus, the current pulled by transistor Q28 from node A comes either from ground or from the output summing line 30, depending on the logic input signal which controls the balance of the network formed by transistors Q21, Q22, Q23, Q24.

Another prior art circuit having the same use as the circuit of FIG. 2, is shown in FIG. 3. In this circuit, a two-branched input is formed by the input transistors Q32, Q33. The input to transistor Q32 is a logic input signal which controls the balance of flow of current from the transistor Q31. The input to transistor Q33 is a logic reference signal which sets the threshold at which the circuit becomes unbalanced, allowing a logic input signal to change the balance of current flow from one branch of the circuit to the other. Current is thereby steered between the transistors Q34 and Q35, pulling current either from the sum line 40 or from digital ground 41. Transistors Q34, Q35 have emitters connected to the common node A' which supplies current pulled by transistor Q36, a current source within the ladder network indicated by the dashed line 39. The resistor R3, connected to transistor Q36 is a resistor in the ladder network and may be one of the resistors in an R-2R network. A more detailed description of the operation of the circuit of FIG. 3 is contained in a paper entitled "An Integrated Circuit 12-Bit D/A Converter" by Robert B. Craven, published in the 1975 IEEE International Solid-State Circuits Conference, Feb. 12, 1975, p. 40. Another well known circuit of the prior art is an integrated circuit known as Motorola MC1508 which is described in a data sheet published by Motorola, Inc., Phoenix, Ariz.

One of the problems present in prior art circuits is that only a single ended output is available, usually the sum line 30 as in FIG. 2 or the sum line 40, as in FIG. 3. In many applications there is a need not only for a summing current, $I_{OUT}$, but for a complementary current, $\overline{I_{OUT}}$. Moreover, prior art switches are not able to switch very low current levels at high speed because of the need to charge parasitic capacitance and the influence of transient signals within the circuit. Another problem with circuits of the prior art is that true current operation is not possible and that logic thresholds are not fully adjustable.

It is therefore an object of the invention to provide an improved DAC for providing complementary outputs with high switching speed and high output compliance.

SUMMARY OF THE INVENTION

The above objects are achieved in a DAC which includes a reference signal generator connected to an electrical $n$-bit weighting network means for decrementing the reference signal to $n$ weighted signal segments corresponding to an $n$-bit weighted order. This network has $n$ ports for communicating one of said $n$ weighted signal segments to a connected transistor switching cell. Each transistor switching cell is connected in parallel to the weighting network and each cell has a balanced two branch input and output means. Each balanced input receives a bit of a binary word which switches the switching cell from conduction in one branch to conduction in another branch. The balanced two branch output means communicates with a balanced load through a pair of output summing lines.

The balanced circuit always pulls current from the electrical $n$-bit weighting network, but the current is shifted between one of the two output summing lines, depending on the binary logic control bits, thereby providing a true current output in one summing line and its complementary true current in the other output lines, in distinction to prior art circuits, which only provided one output.

The improved electrical $n$-bit weighting network includes a master ladder network for decrementing a reference signal into a plurality of decrementally weighted signals and a remainder signal, and a slave ladder network for decrementing the remainder signal by means of scaled transistors. The master-slave realization of an electrical $n$-bit weighting network reduces the number of resistors in comparison to weighting networks of the prior art, so that the circuit of the present invention is more readily adaptable to integrated circuit construction wherein the cost of manufacturing resistors is significantly greater than the cost of manufacturing transistors, when all considerations are taken into account, including the difficulty of controlling resistor values, the amount of surface area of an integrated circuit chip occupied by a resistor, etc.

The combination of the improved transistor switching cells and the improved electrical weighting network may be combined to form a DAC which allows very fast switching of low currents with high output compliance in a pair of complementary output lines.

DESCRIPTION OF THE PREFERRED EMBODIMENT

Figure 1:
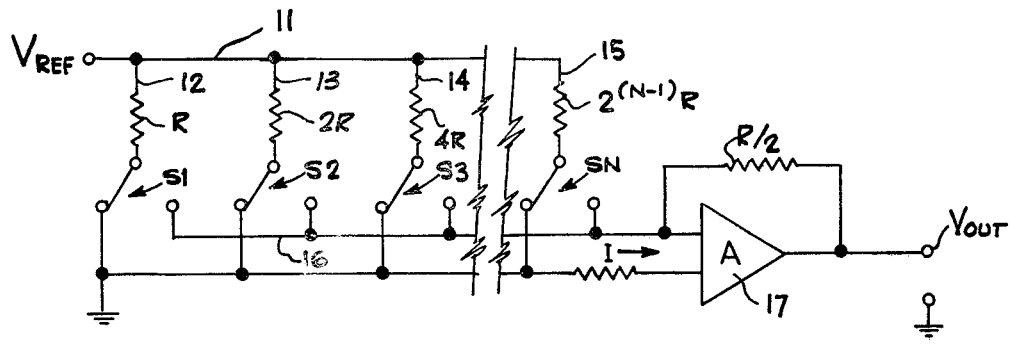
FIG. 1 is a simplified plan view showing use of switches for handling currents, including low level currents in the least significant bit in a digital to analog converter.
Figure 2:
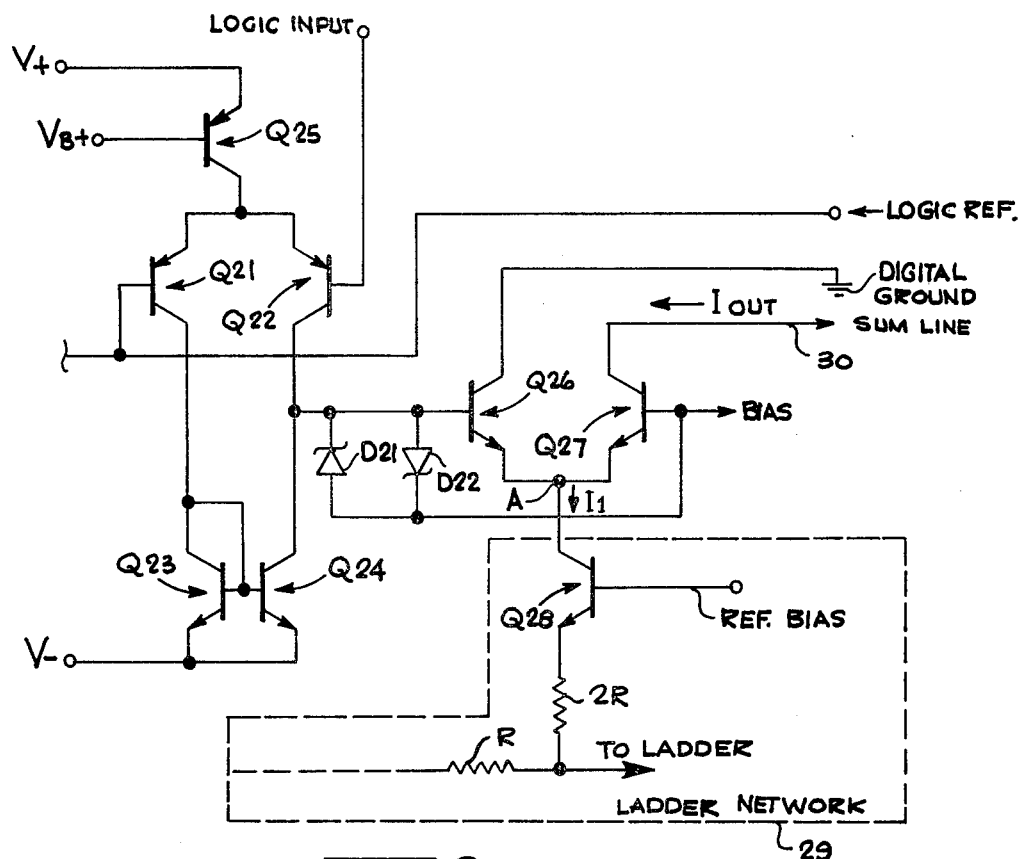
FIG. 2 is an electrical schematic of a prior art transistor switching circuit.
Figure 3:
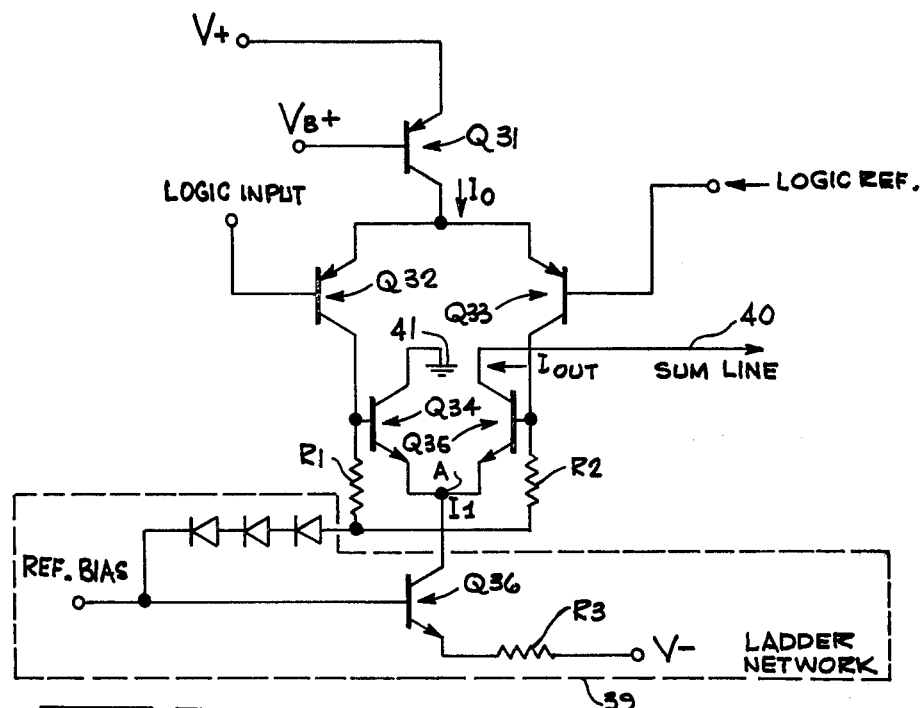
FIG. 3 is another electrical schematic of a prior art transistor switching circuit intended for use in digital to analog converters.

FIGS. 1, 2 and 3, describing prior art circuits have been discussed above. The apparatus of the present invention is described with reference to FIG. 4 which generally shows the switching transistors of the present differential input, differential output current cell between the dashed lines 41 and 43. The first bias circuit of the present invention is situated between dashed lines 43 and 45 and above the dashed line 47. The second bias circuit means of the present invention is to the right of dashed line 45 and below dashed line 47. The third bias circuit means of the present invention is generally to the left of dashed line 41, while the current source and resistor associated with a resistor ladder or other associated circuit for which the high speed switching cell of the present invention is utilized, exists between dashed lines 41 and 43, but below dashed line 49.

The current switch existing between dashed lines 41 and 43 is seen to include a pair of matched level switching transistors Q51 and Q52 arranged symmetrically in left and right hand circuit branches, respectively. The level switching transistors Q51 and Q52 have emitter electrodes 55, 56 respectively which are connected to a first node N. The level shifting transistor Q51 has a control electrode 57 which is connected to receive a logic input signal through resistor 58. The input signal typically has two discrete states including a low state for turning on transistor Q51 and turning off transistor Q52. Current supplied by the current source transistor Q59, termed switch current, is supplied to the load resistor R61 when transistor Q51 is turned on. This current is transmitted to resistor R61 through an output electrode 63 of level shifting transistor Q51. A similar resistor, R62, is connected to the output electrode 64 of the level shifting transistor Q52.

A pair of matched output transistors Q53, Q54 are arranged for symmetrical connection to opposite left and right circuit branches. A control electrode, 71, 72, is connected to the respective circuit branch for receiving control voltages from the resistors R61 and R62.

Each of the transistors Q53, Q54, has a respective common electrode 73, 74 respectively joined at a second node M. Each of the output transistors Q53, Q54 has an output electrode 75, 76 respectively connected to a load 77, 78 communicating directly therewith. Load 77, 78 is terminated in voltages V1, V2 which may be supplied by external circuits. The voltage dropping resistors R61, R62 in respective left and right circuit branches of the apparatus are connected through respective control electrodes 71, 72 to the transistors Q53, Q54.

When a logic input signal turns on transistor Q51, switch current supplied by transistor Q59 is directed to the left hand circuit branch through resistor R61. The voltage drop in the voltage dropping resistor R61 turns on transistor Q53 and turns off transistor Q54 since the voltage drop across resistor R62 is zero.

A high logic input steers steering current through transistor Q52 and activates transistor Q54 thereby pulling current through the resistor load 78 corresponding to a positive "true", or positive "enable", logic operation. Thus, the switch is capable of either positive or negative "true" logic operation, merely by selecting the proper switch output. It is important that the resistors R61 and R62 be matched and are shown to be of equal value at 3,000 ohms each. Similarly, transistors Q53, Q54 are matched, especially with respect to having the same emitter area for carrying the same current therethrough. The matching of transistors Q53 and Q54 and resistors R61 and R62 means that the parasitic capacitance C81 does not need to be charged or discharged to accomplishing switching in either direction thereby permitting higher speed.

A unique advantage of the current cell of the present invention is that it may be tailored for the best transient performance by minimizing the value of resistors R61 and R62, thereby minimizing the voltage swing and sensitivity to logic feedthrough at the bases of transistors Q53 and Q54. The criteria for selecting the value of resistors R61 and R62 is the maximum amount of off-state current which the current switch will tolerate for a given error allocation based upon the value of the steering current and the application of the switching cell.

Transistor switches of the prior art have been limited by parasitic capacitor discharge time, and by positive transients which are coupled into node M, as well as by the frequency response of the transistors themselves. The high speed switching of the present invention is achieved by means of the first, second and third bias circuit means described herein.

The first bias circuit means of the present invention is applied to the base of transistor Q59 on the line designated as $V_{B+}$. If this line were unable to absorb current spikes fed through the collector-base capacitance of Q59 due to the switching of transistors Q51 and Q52 the transients would adversely affect settling time of the overall circuit by modulating the switch current of all switches connected to the same bias line.

Isolation of the first bias circuit which supplies switch current is achieved by providing an integrating amplifier formed by transistors Q83 and Q84. Transistor Q83 sets the supply level of $V_{B+}$ at a level a diode drop below V+ and a network formed by the capacitor C86 and resistor R85 serve to absorb current shocks along the $V_{B+}$ line. R85 and C86 will damp ringing and oscillations on the line. Transistor Q84 provides feedback to transistor Q83, thereby providing stability to the $V_{B+}$ supply. The voltage gain of transistor Q83, typically 4000, effectively multiplies the value of C86 applied to the $V_{B+}$ line. If C86 has a value of 10 pf., the feedback capacitance to $V_{B+}$ is effectively 40,000 pf. The stability of the $V_{B+}$ line is thus such that the same line may supply a plurality of switching circuits and hence the switching circuit of the present invention is termed a cell since a plurality of cells may share a common $V_{B+}$ supply. It will be noted that a current sink I6 pulls on the collector of Q83 and the base of Q84, setting the value of current in Q83, Q59 and Q88.

A second bias circuit means exists to the right of dashed line 45 and below line 47. This bias means supplies the line $V_L$ whose function it is to maintain steady voltage as a logic threshold voltage defining the threshold between high and low logic states. For example, for transistor-transistor logic, TTL, the threshold is 1.4 volts. Current flowing from the collector of Q88 is fed to the base of transistor Q89 and then to ground through diodes D93, D94 and D92. Q89 and D91 also turn on and a current equal to the collector current of Q88 flows in the collector of Q89 and in D91. Q89 and diodes D91 and D92 provide a low impedance to ground such that the entire second bias circuit means is a low impedance bias circuit with high logic line regulation, operating in essentially a Class AB mode. Diodes D91, D92, D93, and D94 may be npn transistors with shorted collectors. The low impedance of the second bias circuit means allows excess base current which is ejected from the base of transistor Q52 to be accommodated during switching by sending it to ground through diodes D91 and D92. Diodes D91 and D92 will be required to sink the full value of the switch current when transistor Q52 first turns on, and as is mentioned previously, this could be happening in many parallel current cells of the same line.

Transistor Q89 sources current when transistor Q52 turns off since transistor Q51 pulls current through the base-emitter capacitance of Q52 and this would change the voltage in the bias line $V_L$ without the second bias circuit means. In other words, if the second bias circuit were not provided, the transistors Q51 and Q52 would change state at a slower rate. Other voltages applied to $V_{LC}$ will set thresholds in the range of $-10$ volts to $+12$ volts, so that true CMOS and ECL compatibility may be achieved.

The third bias circuit means of the present invention, and perhaps the most important, controls the bases of transistors Q53 and Q54 through resistors R61, R62, respectively and specifically sets the voltage levels at nodes X and Y respectively. The voltage level determined by the third bias circuit means is denominated $V_S$ which is set in the emitter in transistor Q97. The collector of transistor Q97 is connected to the positive supply V+ and its base is connected to the same source through a current source means I4. The third bias circuit means which provides the bias to line $V_S$ is a Class A constant current stage. This is a stage which is on at all times with a current sink I5 which is set to have a value equal to the sum of the currents coming from all switches connected to the $V_S$ line plus enough current to absorb all transients and keep transistor Q97 turned on at all times. This requires that transistor Q97 have a cutoff frequency of approximately 500 Mhz and an emitter dynamic impedance being low, approximately 26 ohms at D.C. and 36 ohms at 100 Mhz. The diode D98 and the transistor Q99 serve to reference the base of transistor Q97 to the reference bias line, with the base of Q99 being provided with a reference bias for keeping the transistor Q99 on. Reference bias is also provided to transistor Q101 which pulls current I1, available through node M from one of the loads, indicated by the appropriate logic input signal.

Operation of the transistor switching cell will be explained with reference to a low to high changing input signal, from 0.4 to 2.4 volts, typical for TTL logic, which signal appears at the logic input. If the rise time is short, transistor Q51 will turn off before node N reaches a voltage of $V_L + V_{BE}$ where $V_{BE}$ is the base-emitter drop of transistor Q52. This is the case because the base-emitter junction of Q51 will turn off and parasitic capacitance will delay the rise of node N. Transistor Q51 turns off typically in less than 10 nanoseconds and node X begins a resistive-capacitive discharge towards bias voltage $V_S$. If resistor R61 is 3,000 ohms, as shown, and parasitic capacitance at node X is 2 pf, then the RC time constant for the left hand branch is 6 nanoseconds. Node N would charge from 1.1 to 2.1 volts which would require approximately 20 nanoseconds. The net result is that, if no other transients are involved, node X falls before node Y rises and thus node M is allowed to discharge toward V—. When node Y rises, Q54 turns on and pulls node M up to its proper operating voltage. The switch turn on propagation delay is therefore determined by the charging rate of node N, frequency response of transistor Q52, and the charging rate of node Y. A typical turn on delay is in the range of 30 to 35 nanoseconds for a wide range of current.

With reference to a high to low changing input signal transistor switching cell is much less dependent on node N. When transistor Q51 turns on, it pulls node N down and promptly turns off transistor Q52. Node Y falls and node X rises at very close to the same time, so that switching is fairly symmetrical. In optimum operation of the circuit, voltages on the lines $V_L$, $V_S$, and $V_{B+}$ are constant and no parasitic effects except the charging and discharging of nodes M, N, X and Y are involved.

If the $V_S$ line changes voltage level during switching, especially in the positive direction, the transistor switching cell of the present invention will not be useful at low current levels. A positive transient on the $V_S$ line will cause the bases of Q53 and Q54 to rise, and the transistor which is on will pull node M up by the peak value of the positive transient. When $V_S$ and the bases return to their proper level, node M will remain high and must be discharged by switch current. A 0.5 volt transient with steering current I1 at a level of 1 microampere and capacitance of the parasitic capacitor C81 at a level of 2 picofarads would cause a delay of 1,000 nanoseconds. A current level of 100 nanoamperes would have a propagation delay 10 times as great, and the advantage of the fully differential switching action would be lost.

There are several ways in which a transient may be coupled into the $V_S$ line, and a wideband, low impedance bias regulator must be used so that current spikes do not disturb $V_S$. Two forms of current spiking are caused by the switching action of transistors Q51 and Q52. With a low to high level logic input transition, Q51 turns off before Q52 turns on. This causes an interruption in the current which is delivered to the $V_S$ line, which can cause a transient at the turnoff of transistor Q51 and at the turnon of transistor Q52. A high to low transition at the logic input will cause extra current to appear at the collector of Q51, due to the fast discharge of parasitic capacitance at node N. If the $V_S$ is poorly regulated, this will cause a positive transient, which will be even more pronounced if several switches are operating simultaneously.

The high frequency response of transistor Q97 and the fact that a current sink, I5, is always pulling current from the emitter of Q97 allows transistor Q97 to remain on at some current level thereby stabilizing the $V_S$ line, making it less sensitive to transients. The suppression of transients on the $V_S$ line inhibits their coupling into node M through the transistors Q53 and Q54. All of the bias circuit means, the first, second and third, have as their object the stabilization of node M against transients.

Fast logic transitions can couple current spikes directly through the collector-base capacitance of transistor Q51 into node X, and then into node M. For example, a 0.4 to 2.4 volt input change in 5 nanoseconds, with a collector base capacitance in transistor Q51 of 0.5 picofarads, will cause a 200 microampere spike which is equivalent to 600 millivolts in a 3,000 ohm load resistor. This would cause a turnon delay of greater than 1 microsecond at a 1 microampere switch current. One way to reduce this spike is to filter the input signal, which may easily be accomplished by placing resistor 58 connected to the base of transistor Q51, so that the parasitic collector-base capacitance and the base-isolation capacitance will be charged and discharged slowly. The base resistance 58 of transistor Q51 may be as high as 10 K ohms since the switch input current is typically only 2 microamperes. Parasitic capacitance of 2 picofarads would yield of time constant of 20 nanoseconds.

Figure 4:
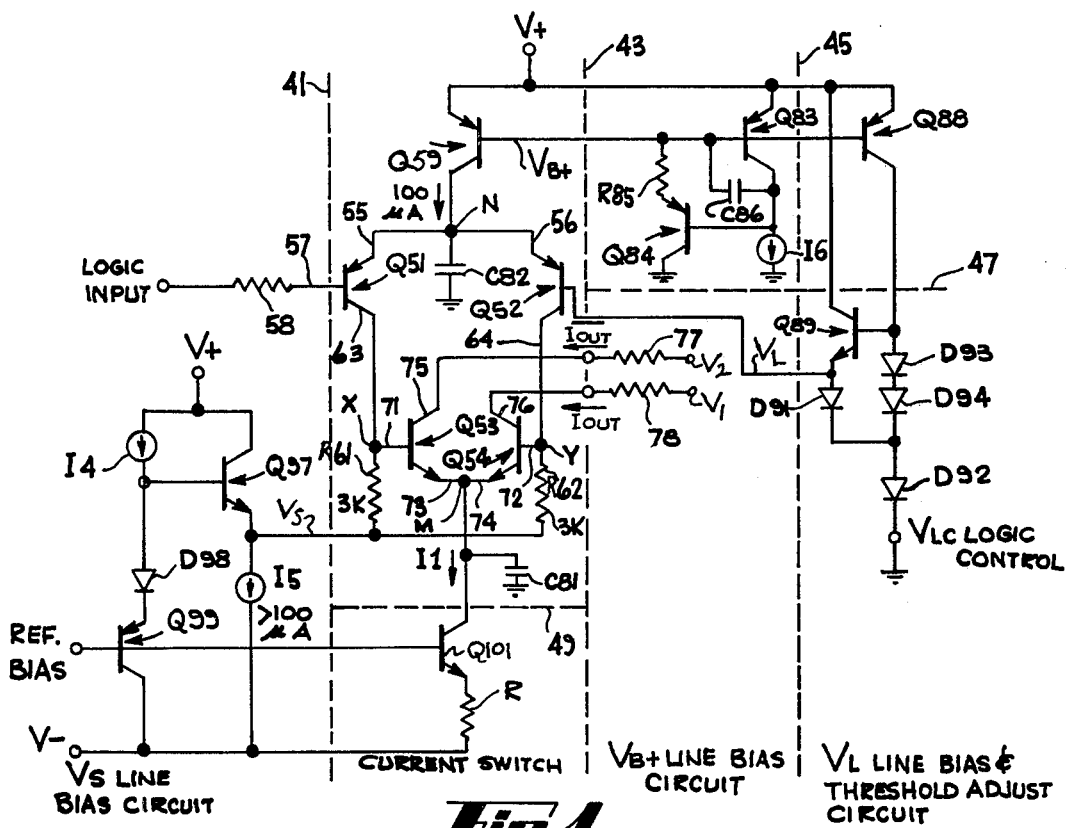
FIG. 4 is an electrical schematic of a differential input, differential output current cell for low current level, high speed operation, with complementary true current outputs.

Although not shown in the embodiment of FIG. 4, Schottky or standard diodes may be clamped across resistors R61 and R62 to reduce logic signal feedthrough to the bases of Q53, Q54.

Figure 5:
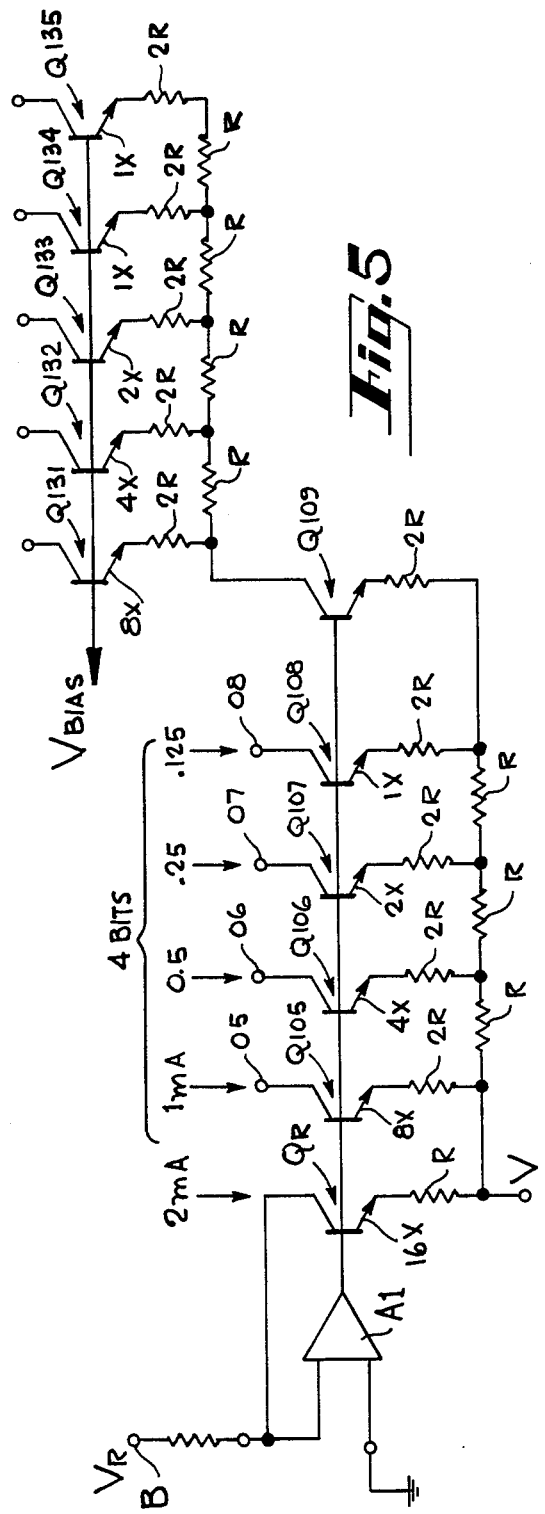
FIG. 5 is an electrical schematic of a master-slave ladder for decrementing current.

As mentioned previously, the transistor switching circuits of the present invention have diverse applications, including one application wherein very low levels of current are switched in digital to analog converters. Such converters are typically formed by the combination of such switches with a resistive ladder, indicated in FIG. 1. A preferred type of resistive ladder is described in my copending U.S. Pat. application Ser. No. 642,770 and such a electrical ladder may be combined with the switches herein for a preferred digital to analog converter. The preferred ladder, termed a master-slave ladder, utilizes the principle of scaled emitters for decrementing an input signal. FIG. 5 illustrates such scaling wherein the emitter of each transistor is tagged with a number indicating the scaling ratio, i.e. 16x, 8x, 4x, 2x, 1x. The master ladder, comprising the transistors QR, Q105, Q106, Q107, Q108 has scaled emitters which comprise a scaling means of the type known in the prior art. The master ladder comprising these transistors also includes an input reference signal generated from the input amplifier A1 which is typically an operational amplifier connected to a reference voltage, $V_R$, which supplies reference current to the master ladder outputs. The master ladder decrements the input signal into a plurality of weighted signals, one signal associated with each transistor of the ladder plus a terminating transistor for generating a remainder from the leftover signal.

Figure 6:
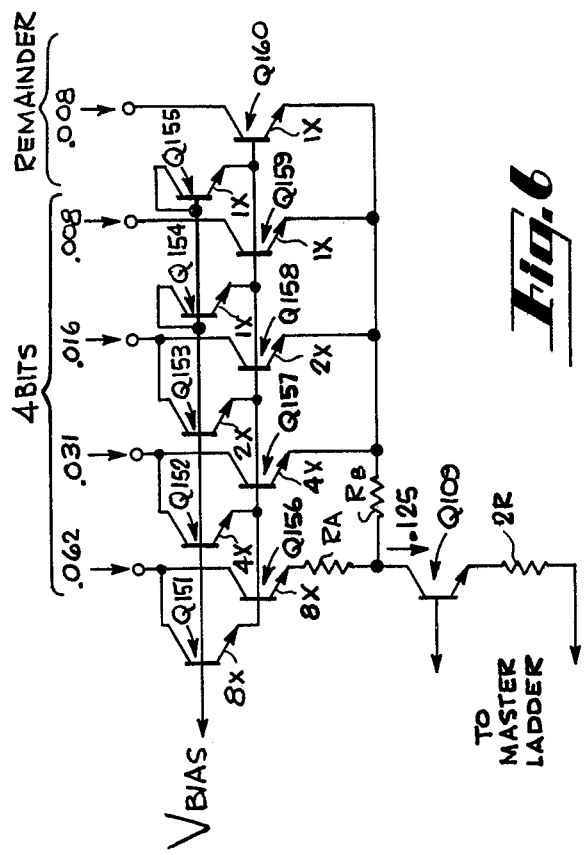
FIG. 6 is an electrical schematic of an improved slave ladder for use with a master ladder in decrementing current.

A slave ladder network is provided with a second signal signalling means which receives the remainder signal from the master ladder and divides it into a plurality of decrementally weighted signals which are delivered to the second outputs, associated with transistors Q131, Q132, Q133, Q134 and Q135. It is seen that the resistors in both the master and slave ladders are of the R-2R type, although such is not necessary. Instead, the remainder signal from transistor signal Q109 may be decremented as shown by the arrangement of transistors in FIG. 6. In FIG. 6 the master ladder, not shown, comprises an R-2R resistor network connected to the transistors Q105, Q106, Q107, Q108 and Q109 as in FIG. 3. A reference signal is applied to the input node B by the voltage $V_R$ which is fed to the operational amplifier A1 which in turn drives the reference transistor QR. Each of the transistors in the master ladder Q105–Q108 has a respective node O5–O8 for outputting decrementally reduced current levels to the transistor switches previously described, with such current levels typically given by the values indicated on the figure, whereas the input current through the reference transistor QR may be of the order of 2 milliamps, the decremented current levels through Q105–Q108 are respectively 1 ma., 0.5 ma., 0.25 ma., 0.125 ma. and in the terminating transistor Q109 another 0.125 ma.

The slave ladder connected to the collector of transistor Q109 in FIG. 6 includes the transistors Q151, Q152, Q153, Q154, Q155 which divide the total base current of transistors Q156–Q160 and apply it in a scaled manner to the outputs of transistors Q156–Q160. Thus the effective current gain of transistors Q156–Q160 is multiplied by the current gain of the corresponding transistor in the series Q151–Q155 and the collector current error caused by the base currents of Q156–Q160 is reduced by a factor of $\beta$ of the compensating transistors Q151–Q155. The collector of transistor Q156 is connected to the collector of transistor Q151; the collector of transistor Q157 is connected to the collector of transistor Q152; and so on. The compensating transistors Q151–Q155 have base-emitter junctions scaled in the same proportion as the transistors of the slave ladder network Q156–Q160, to which it is connected. Thus, the base-emitter junctions of the transistors Q151–Q155 are scaled in an eight to one ratio as indicated in the figure, the same ratio as the emitters of Q156–Q160. By scaling in this manner, the transistor Q151 is able to provide proportionally a greater amount of feedback of base error current to the transistor Q156 which is contributing a proportionally larger share of the error current because of its scaled emitter.

In FIG. 6 the two resistors $R_A$ and $R_B$ are of equal value and large compared to the dynamic emitter resistance of transistors Q156 and Q157, serving to divide the remainder current from the transistor Q109 into equal parts. The reason that it is desired to split the current for terminating transistor Q109 into roughly equal parts is that it is known that approximately 50% of the error generated in the slave network Q156–Q160 is allocated to the transistor Q156. Since Q151 feeds back base current which should compensate for the base error current, the transistor Q156 contributes very little output error current. This is desirable because the output of transistor Q156 represents the most significant signal or bit with reference to the remaining transistors, since the most significant bit is defined as the one having the greater increment of current and the least significant bit is the one having the most decremented signal level. According to this scheme, half of the error budget is then allocated to the transistors Q157–Q160 and no further resistors are provided since the scaling provided in the transistors Q157–Q160 provides a good approximation for the manner in which the emitter current is to be allocated. In other words, allocation of current flowing through $R_B$ is exactly in proportion to the sum of the sizes of the base-emitter junction of the slave ladder transistors Q157–Q160. One of the reasons that further resistors are not provided for a more perfect allocation of the error signal budget is that in integrated circuit construction the cost of providing such resistance in terms of surface area of an integrated circuit chip is large and for the least significant bits of the slave ladder the error budget allocation made by scaled emitter transistors Q157–Q160 is adequate for yielding good accuracy. The transistor Q160 and its associated feedback transistor Q155 terminate the slave ladder by providing a terminating means which duplicates the least significant bit, transistor Q159 and its associated feedback transistor Q154.

The master-slave ladder implicit in FIG. 6 shows current outputs of the slave ladder to be 0.062 ma., 0.031 ma., 0.016 ma. and 0.008 ma. representing the least significant bits, whereas it is seen that a most significant bit in the master ladder portion of the apparatus is illustrated in FIG. 5 where 1 ma., 0.5 ma., 0.25 ma. and 0.125 ma. All of the transistors of the master-slave ladder are of the same type when the apparatus is constructed by means of integrated circuit construction. Moreover, since the scaling ratios are the same for the master and slave ladders, another processing benefit is achieved inasmuch as minimal scaling ratio is achieved for an electrical ladder having a large number of current outputs. In the slave ladder, note that the collector of transistor Q154 is connected to its base, thereby providing for faster switching of the current switching cell which is attached to the collector of Q159. This means that the collector of transistor Q159 receives no feedback current and that its output error current will be greater. However, since this is the least significant bit, the increased error current is sacrified for the advantage of being able to switch the current therein faster in the connected current switching cell.

Figure 7A:
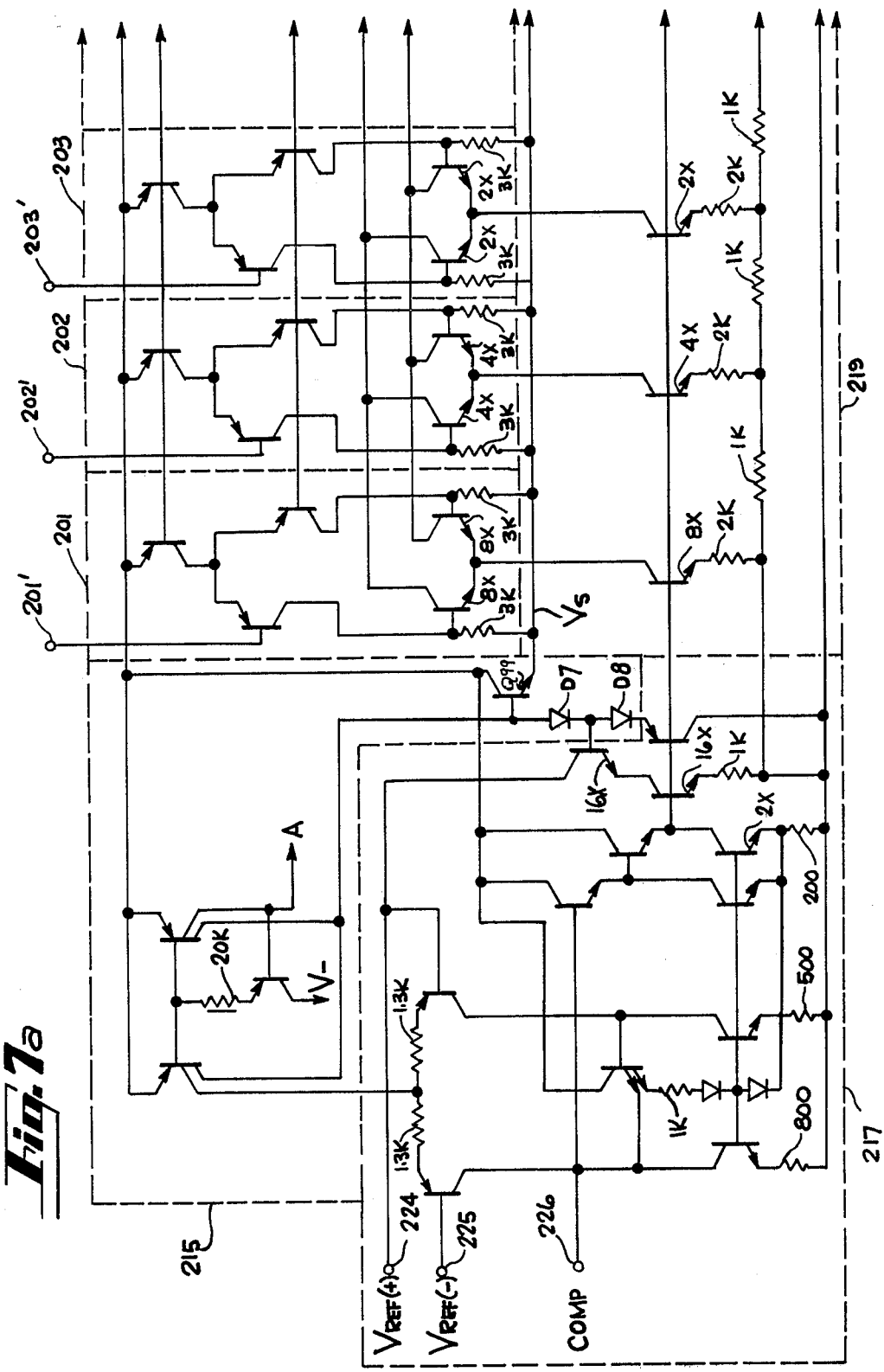
FIGS. 7a and 7b are an electrical schematic of a digital to analog converter utilizing a complementary current, fully differential input, differential output current cell in combination with an improved master-slave ladder for decrementing currents.
Figure 7B:
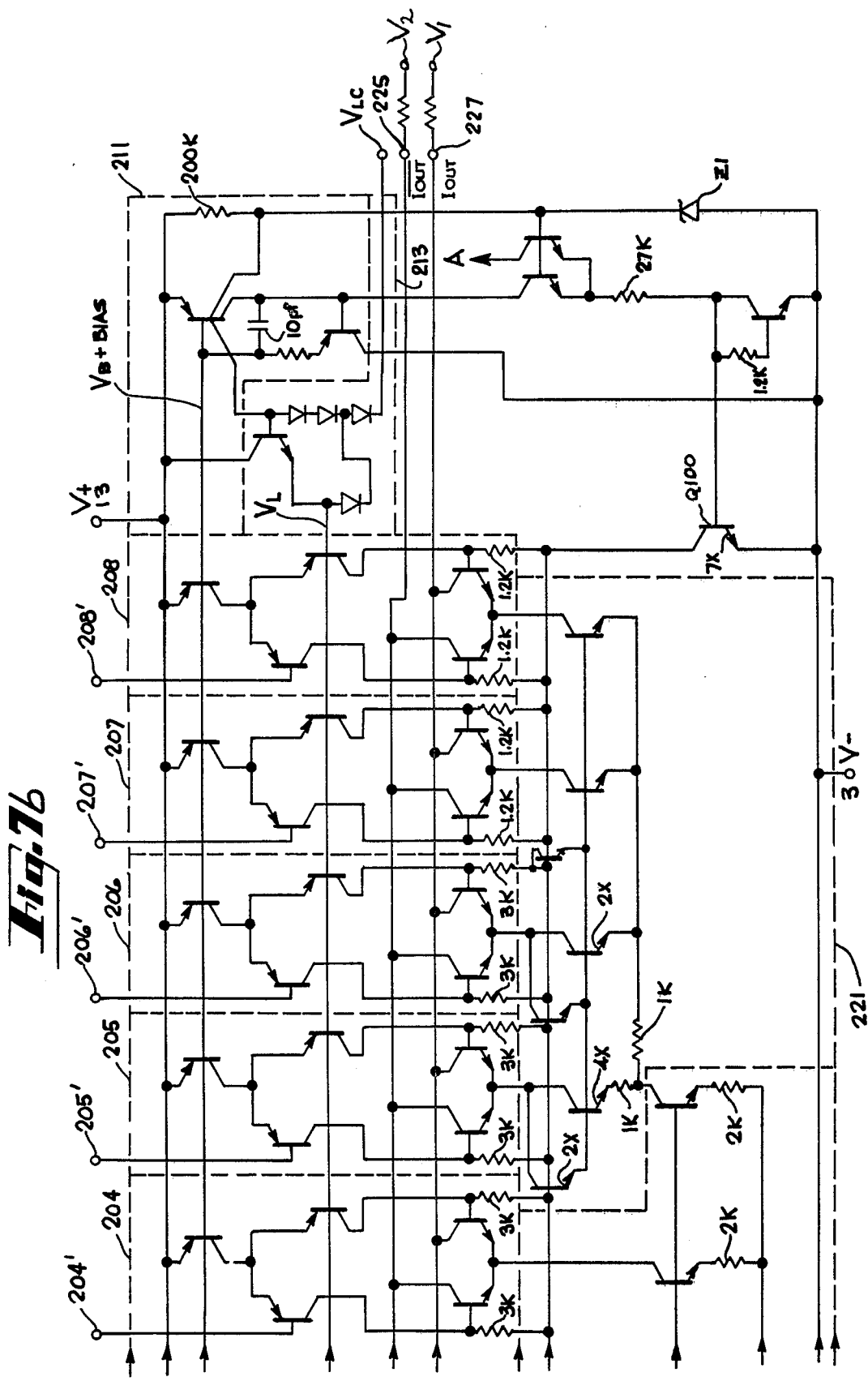

FIG. 7 shows a complete digital to analog converter using the current switching cells described herein, together with the improved master-slave ladder. The complete digital to analog converter includes differential input, differential output current cells 201, 202, 203, 204, 205, 206, 207 and 208. Each switching cell has a corresponding logic input 201', 202', 203', 204', 205', 206', 207' and 208' for applying, in parallel, a high or low logic signal corresponding to an eight bit digital word. Each corresponding current cell is switched in accord with the high or low nature of a corresponding bit of such a word in the manner previously described with reference to FIG. 4.

The first bias current means for providing the bias $V_{B+}$ is shown within the block identified by the dashed line 211.

The second bias circuit means for supplying the voltage $V_L$, previously described, is within the dashed line 213.

The third bias circuit means for providing the bias level $V_S$ is shown within the block defined by the dashed line 215. A portion of the third bias circuit means includes a pulldown current source transistor Q100 whose collector is connected to the line which carries all switch resistors and the emitter of Class A npn transistor Q99. The operational amplifier for providing an input reference signal is shown within the block defined by the dahsed line 217. In actual use, a reference resistor is connected between a voltage reference $V_{REF}$ and node 224. A negative reference signal $V_{REF(-)}$ may be applied at node 225. The master ladder is shown within the block 219 with an R-2R network therein with resistors of value 2K and 1K.

A slave ladder is shown to be connected to the terminating transistor of the master ladder within the dashed line 221. This slave ladder is similar to the slave ladder illustrated with respect to FIG. 6.

It will be seen that the output of each of the transistors in the master ladder and slave ladder is connected to a corresponding common node of a switching cell. Each of the switching cells is connected to a respective common output load line 227, 228 for generating true high compliance current outputs, $I_{OUT}$ and its complement $\overline{I_{OUT}}$. Output load lines 227, 228 may terminate in voltages V1, V2, supplied by external circuits.

Figure 8:
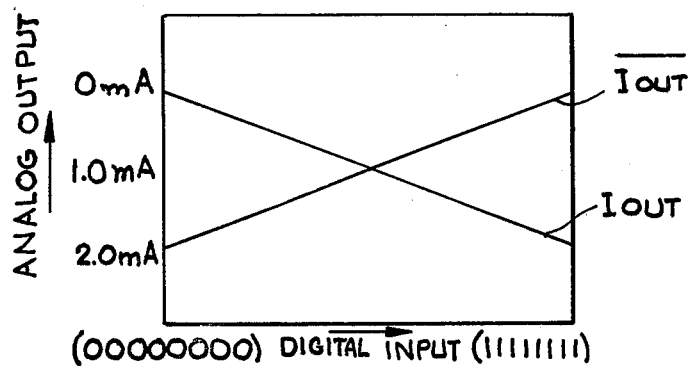
FIG. 8 is a plot of typical transfer characteristics of the digital to analog converter of the present invention.

FIG. 8 shows a typical transfer characteristic of the apparatus of the present invention where a digital input signal is plotted as the abscissa and analog output is plotted as the ordinate, for both the current output, $I_{OUT}$, and its complement $\overline{I_{OUT}}$.

As the digital input is counted through the 256 states from 00000000 to 11111111, $I_{OUT}$ changes in increments of 8 microamps from 0 to 1.992 mA, while $\overline{I_{OUT}}$ changes from 1.992 mA to 0. The sum of $I_{OUT}$ and $\overline{I_{OUT}}$ is always constant, being the sum of all the bit weights, or decremented current sources associated with each switch.

Figure 9:
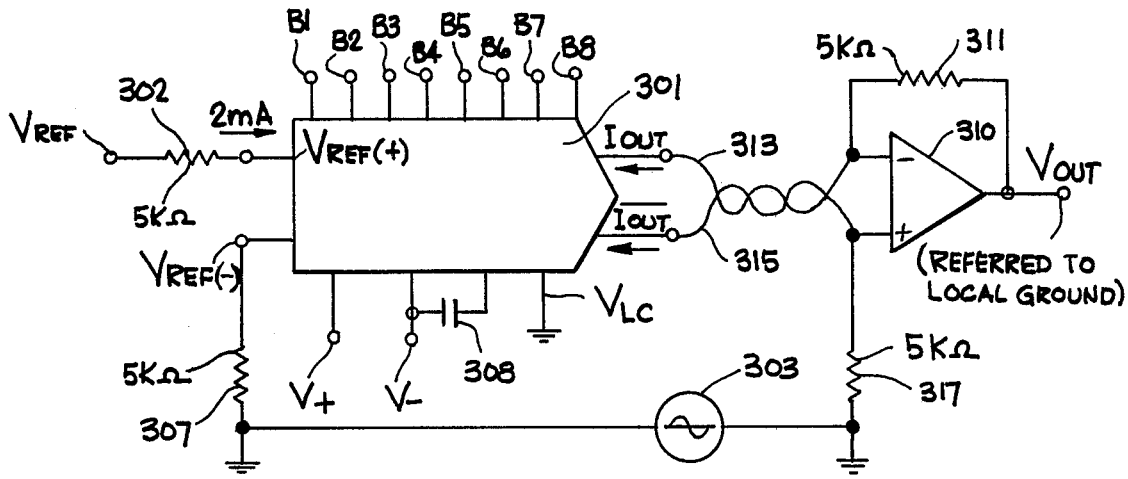
FIG. 9 is an electrical plan for connection of the digital to analog converter of the present invention to a balanced load.

FIG. 9 shows the DAC of the present invention, 301, having a plurality of input terminals, B1, B2, B3, B4, B5, B6, B7, and B8 for receiving 8 binary bits of an 8 bit digital word as logic control bits for the transistor switching cells of the present invention. A voltage reference, $V_{REF}$, is applied to the resistor 302 for internal utilization within DAC 301. Such internal utilization includes the generation of a reference signal for application to the electrical weighting network as well as application to the third bias circuit means of the switching cells. The negative reference voltage $V_{REF(-)}$ is applied to resistor 307 and serves as the negative reference, with respect to the positive. The negative reference is seen connected to ground through a 5,000 ohm resistor. Positive and negative supply voltages V+ and V−, as well as a logic control reference signal $V_{LC}$ are also supplied for operation of the switching cells, as described above. A common mode voltage source 303 is shown to be connected between lines 307 and 317, to indicate an external connection to another circuit between the input and the output of the present DAC. The output summing lines which carry the currents $I_{OUT}$ and $\overline{I_{OUT}}$ are shown as lines 313, 315 which may be connected to a load 310, shown to be an operational amplifier. A differential amplifier is but one type of balanced load, other types including transformers, oscilloscopes and the like. Resistor 311 is a feedback resistor which is a typical auxiliary element of an operational amplifier. The output of amplifier 310, $V_{OUT}$ is referenced to local ground, at the right of generator 303.

The circuit of FIG. 9 is a balanced load and as such detects the difference between the currents $I_{OUT}$ and $\overline{I_{OUT}}$ and converts this difference into an output voltage $V_{OUT}$ yielding a coding format known as offset binary. The twisted pair of wires denotes the possible use of a transmission line for current transmission between the DAC and the amplifier, which may be at different locations with different ground potentials, denoted by the common mode generator 303. For example, with a digital input of 00000000, no current flows in the $I_{OUT}$ terminal while 1.992 mA flows at $\overline{I_{OUT}}$. No current flows in resistor 311 except the bias current to the (−) input of the operational amplifier, and the amplifier functions as a voltage follower with a gain of +1. $V_{OUT}$ is thus equal to the voltage at the (+) input of the amplifier, which is −9.920 volts due to the voltage across resistor 317 created by $\overline{I_{OUT}}$. At the opposite input code of 11111111, $I_{OUT}$ equals 1.992 mA and $\overline{I_{OUT}}$ equals zero. No current flows in resistor 311 except the amplifier bias current, so the voltage at both amplifier inputs is essentially zero and the amplifier functions as a current to voltage converter with $I_{OUT}$ supplied by the amplifier through feedback resistor 311, with $V_{OUT}$ having a value of +9.920 volts. For all other input codes, some current flows in each of the resistors 311 and 317, and the balanced load converts the current difference to an output voltage. As shown in Table 1, the output is symmetrical around zero volts. In prior art circuits, the most common method of making the output symmetrical about zero involves injecting a half scale current into the DAC output which is dependent on the value of reference voltage. The circuit of the present invention generates a symmetrical output independent of the value of reference voltage, requiring only that the two resistors 311 and 317 are matched. Since the value of $V_{OUT}$ depends only on the difference between $I_{OUT}$ and $\overline{I_{OUT}}$, the common voltage level of the ground, also known as the output common mode voltage, may be different than the voltage at the reference ground, as indicated by the presence of the common mode voltage generator 303. A difference in common mode voltages between the reference and output circuits could exist due to noise, stray currents in ground leads, or could be induced by the application of a bias voltage or a signal to the lower end of resistors 307 or 317.

TABLE 1

| | B1 | B2 | B3 | B4 | B5 | B6 | B7 | B8 | $I_O$ma | $\overline{I_O}$ma | $V_{OUT}$ |
|---|---|---|---|---|---|---|---|---|---|---|---|
| POS Full Scale | 1 | 1 | 1 | 1 | 1 | 1 | 1 | 1 | 1.992 | .000 | +9.920 |
| POS Full Scale −1LSB | 1 | 1 | 1 | 1 | 1 | 1 | 1 | 0 | 1.984 | .008 | +9.840 |
| (+) Zero Scale | 1 | 0 | 0 | 0 | 0 | 0 | 0 | 0 | 1.000 | .992 | +0.040 |
| (−) Zero Scale | 0 | 1 | 1 | 1 | 1 | 1 | 1 | 1 | .992 | 1.000 | −0.040 |
| Neg Full Scale +1LSB | 0 | 0 | 0 | 0 | 0 | 0 | 0 | 1 | .008 | 1.984 | −9.840 |
| Neg Full Scale | 0 | 0 | 0 | 0 | 0 | 0 | 0 | 0 | .000 | 1.992 | −9.920 |

Symmetrical Output of Figure 9

Figure 10:
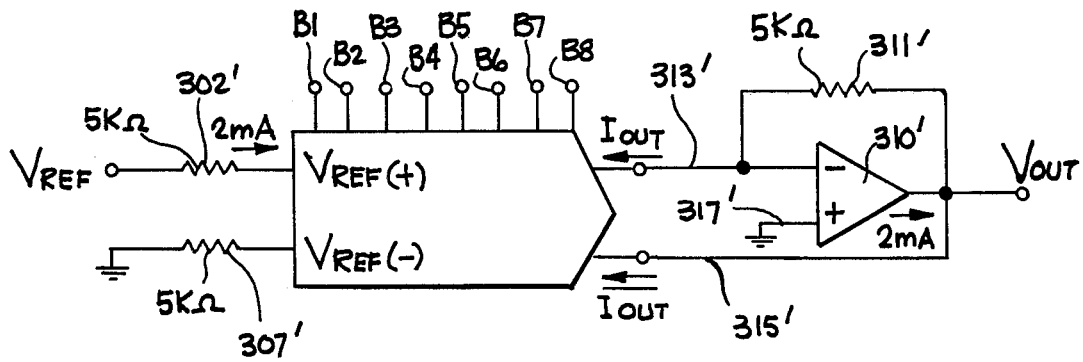
FIG. 10 is an electrical plan view of the digital to analog converter of the present invention connected to a single load.

FIG. 10 shows an alternate utilization of the DAC 301' of the present invention wherein the voltage reference, $V_{REF}$, is supplied to the input resistor 302' while the corresponding $V_{REF(-)}$ resistor, 307', is grounded. One of the two output lines of DAC 301', namely summing line 313' is connected to one of the inputs of an operational amplifier 310', the other input 317' being grounded. The complementary output of line 313' is taken along line 315' and applied as an output to amplifier 310'. At the same time feedback is provided from the connection of line 315' to said output back to the input of operational amplifier 310', through the line 311' which includes a feedback resistor. In this configuration, the current output, $I_{OUT}$ drives the operational amplifier 310', while the complementary output, $\overline{I_{OUT}}$ stabilizes the output of the operational amplifier by providing constant current loading.

Operational amplifiers have frequency response limitations which make them unable to respond instantly to changes in output loading. The circuit of FIG. 10 shows a signal ended load with $\overline{I_{OUT}}$ connected to provide a constant current load at the output of amplifier 310', decreasing the settling time when the digital input of the DAC changes. Even though the current in resistor 311' changes, the amplifier always supplies the sum of $I_{OUT}$ and $\overline{I_{OUT}}$, which is a constant 2 mA. Because the DAC has true current outputs, the voltage at terminal 317' may be a common mode voltage other than ground.

In summary it may be seen that the DAC of the present invention provides for both positive or negative logic operation depending upon which of the two output summing lines is selected. Moreover, it is apparent that the two output lines are suitable for driving balanced loads.

Another advantage of the present invention is that the circuit described herein pulls a constant current from the load which may be important in selected applications. The apparatus possesses high voltage output compliance, which means that the output may be used over a wide range of output voltages, yet maintaining the same value of current, thereby defining a true current output. This results from high output impedance of the transistor switching cell. In the present invention the allowable output voltage may swing between +18 volts and −10 volts, with typically less than a 0.1% change. A further advantage of the present invention is that there is low propagation delay and settling time at low current levels. For example, the DAC of the present invention will switch current from a level of 4 milliamps down to slightly less than 1 microamp with a propagation delay of less than 40 nanoseconds. The current level of 100 nanoamps, propagation delay is still under 150 nanoseconds.

I claim:

1. A digital-to-analog converter comprising,
   means for converting a reference signal from a voltage reference signal to a current reference signal,
   an electrical n-bit weighting network means for receiving said converter reference signal and for decrementing said reference signal into $n$ weighted signal segments corresponding to a weighted $n$-bit order, said weighted network having $n$ ports, each port for communicating one of said $n$ weighted signal segments,
   a plurality of $n$ parallel transistor switching cells connected for receiving a binary input word of $n$-bit length wherein one of said bits operates as a logic control for a corresponding switching cell, each of said switching cells comprising,
   (a) a balanced transistor input means having two branches operated by switch current supplied from a source, said branches receiving said logic control bit and a threshold adjustment voltage, and for switching switch current alternately between one of said two branches and the other, in response to said logic control bit, and
   (b) a balanced transistor output means having two branches, each branch connected to a corresponding branch of input means, for communicating steering current to a load associated with each branch of the output means depending upon the existence of switch current in the corresponding branch of the input menas, said steering current from each of said switching cells continuously supplied to ports of said $n$-bit weighting network through electrical connections therewith for enabling weighted signal segments in said output load with said logic control bits,
   a pair of output summing line means, each summing line means adapted for connection to a load and for receiving an amount of steering current from each switching cell corresponding to a decremented signal segment from said weighting network, and summing said steering current in each summing line, thereby forming a first current output in one output summing line and another current output complementary in amplitude to said first current output in the other output summing line, and
   a plurality of bias circuits, each connected to said transistor switching cells and each including means for stabilizing switching action of said switching cells thereby enabling true current outputs.

2. The apparatus of claim 1 wherein said balanced two branch input means comprises a left branch and a right branch having a first node in common, said first node connected to a first bias circuit means of said plurality of bias circuits for supplying switch current, said first bias means including an integrating amplifier means for stabilizing the level of said switch current.

3. The apparatus of claim 1 wherein said balanced two branch input means comprises a left branch and a right branch, said right branch connected to a second bias circuit means of said plurality of bias circuits for generating a constant voltage as a threshold adjustment signal for said logic input signal.

4. The apparatus of claim 1 wherein said balanced two branch output means includes a second node, said second node connected to a third bias circuit means of said plurality of bias circuits for isolating transients from the second node when switching current between said branch.

5. The apparatus of claim 1 wherein each balanced output branch includes a load.

6. The apparatus of claim 1 wherein each balanced output branch is connected to a common balanced load.

7. The apparatus of claim 1 wherein one of said two branched input means includes an input resistor means for filtering transients.

8. The apparatus of claim 1 wherein said electrical $n$-bit weighting network comprises,
   a master ladder network having a first signal scaling means having a plurality of first scaled transistors connected for receiving said reference signal and dividing it into a plurality of decrementally weighted signals, one of said first scaled transistors associated with each decrementally weighted signal,
   a first terminator means for generating a first remainder signal from said master ladder network, and
   a first slave ladder network having a second signal scaling means includes a plurality of second scaled transistors connected to said master ladder for receiving said generated first remainder signal from said first terminator means and dividing it into a plurality of decrementally weighted signals, one of said second scaled transistors associated with each decrementally weighted signal, and a second terminator means for generating a second remainder signal from said first slave ladder network.

9. The apparatus of claim 8 wherein said second signal scaling means includes an R-2R resistor ladder.

10. The apparatus of claim 8 wherein said second signal scaling means comprise cascaded scaled transistors, each scaled transistor having base current compensation means with output electrodes for providing base current feedback to selected cascaded scaled transistors.

11. The apparatus of claim 10 wherein said base current compensation means comprises scaled transistors.

12. The apparatus of claim 10 wherein said selected cascaded scaled transistors receiving base current feedback are all transistors of said second scaling means.

13. The apparatus of claim 5 wherein the load in each branch is a resistor.

14. The apparatus of claim 6 wherein said common balanced load is an operational amplifier.

15. The apparatus of claim 1 further defined by an output load circuit means connected to said pair of output summing line means for providing the sum of the current output and its complement current.

16. A circuit for decrementing a reference current signal comprising, an electrical $n$-bit weighting network means for receiving said converted reference signal and for decrementing said reference signal into $n$ weighted signal segments corresponding to a weighted $n$-bit order, said weighting network having $n$ ports, each port for communicating one of said $n$ weighted signal segments, a plurality of $n$ parallel transistor switching cells connected for receivng a binary input word of $n$-bit length wherein one of said bits operates as a logic control for a corresponding switching cell, each of said switching cells comprising,
 (a) a balanced transistor input means having two branches operated by switch current supplied from a source, said branches receiving said logic control bit and a threshold adjustment voltage, and for switching switch current alternately between one of said two branches and the other, in response to said logic control bit, and
 (b) a balanced transistor output means having two branches, each branch connected to a corresponding branch of input means, for communicating steering current to a load associated with each branch of the output means depending upon the existence of switch current in the corresponding branch of the input means, said steering current from each of said switching cells continuously supplied to ports of said $n$-bit weighting network through electrical connections therewith for enabling weighted signal segments in said output load with said logic control bits, and a pair of output summing line means, each summing line means adapted for connection to a load and for receiving an amount of steering current from each switching cell corresponding to a decremented signal segment from said weighting network, and summing said steering current in each summing line, thereby forming a first current output in one output summing line and another current output complementary in amplitude to said first current output in the other output summing line, and a plurality of bias circuits, each connected to said transistor switching cells and each including means for stabilizing action of said switching cells thereby enabling true current outputs.

17. The apparatus of claim 16 wherein said balanced two branch input means comprises a left branch and a right branch having a first node in common, said first node connected to a first bias circuit means of said plurality of bias circuits for supplying switch current, said first bias means including an integrating amplifier means for stabilizing the level of said switch current.

18. The apparatus of claim 17 wherein said first bias input means comprises a left branch and a right branch, said right branch connected to a second bias circuit means of said plurality of bias circuits for generating a constant voltage as a threshold adjustment signal for said logic input signal.

19. The apparatus of claim 16 wherein said balanced two branch output means includes a second node, said second node connected to a third bias circuit means of said plurality of bias circuits for isolating transients from the second node when switching current between said branch.

20. The apparatus of claim 16 wherein each balanced output branch includes a load.

21. The apparatus of claim 16 wherein each balanced output branch is connected to a common balanced load.

22. The apparatus of claim 16 wherein one of said two branched input means includes an input resistor means for filtering transients.

23. The apparatus of claim 16 wherein said electrical $n$-bit weighting network comprises, a master ladder network having a first signal scaling means having a plurality of first scaled transistors connected for receiving said reference signal and dividing it into a plurality of decrementally weighted signals, one of said first scaled transistors associated with each decrementally weighted signal, a first terminator means for generating a first remainder signal from said master ladder network, and a first slave ladder network having a second signal scaling means includes a plurality of second scaled transistors connected to said master ladder for receiving said generated first remainder signal from said first terminator means and dividing it into a plurality of decrementally weighted signals, one of said second scaled transistors associated with each decrementally weighted signal, and a second terminator means for generating a second remainder signal from said first slave ladder network.

24. The apparatus of claim 23 wherein said second signal scaling means includes an R-2R resistor ladder.

25. The apparatus of claim 24 wherein said base current compensation means comprises scaled transistors.

26. The apparatus of claim 24 wherein said selected cascaded scaled transistors receiving base current feedback are all transistors of said second scaling means.

27. The apparatus of claim 20 wherein the load in each branch is a resistor.

28. The apparatus of claim 21 wherein said common balanced load is an operational amplifier.

29. The apparatus of claim 16 further defined by an output load circuit means connected to said pair of output summing line means for providing the sum of the current output and its complement current.

30. The apparatus of claim 23 wherein said second signal scaling means comprise cascaded scaled transistors, each scaled transistor having base current compensation means with output electrodes for providing base current feedback to selected cascaded scaled transistors.

* * * * *